(12) United States Patent
Wang

(10) Patent No.: US 7,923,181 B2
(45) Date of Patent: Apr. 12, 2011

(54) METHODS OF FORMING PHOTOMASKS

(75) Inventor: Fei Wang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 115 days.

(21) Appl. No.: 12/396,893

(22) Filed: Mar. 3, 2009

(65) Prior Publication Data
US 2010/0227260 A1 Sep. 9, 2010

(51) Int. Cl.
*G03F 1/00* (2006.01)
*G03F 7/00* (2006.01)

(52) U.S. Cl. .......... 430/5; 430/311
(58) Field of Classification Search ...... 430/5, 311–313, 430/322–324; 257/292
See application file for complete search history.

(56) References Cited

U.S. PATENT DOCUMENTS

| | | | |
|---|---|---|---|
| 5,411,824 A * | 5/1995 | Vasudev et al. | 430/5 |
| 5,418,095 A * | 5/1995 | Vasudev et al. | 430/5 |
| 5,851,706 A * | 12/1998 | Lim et al. | 430/5 |
| 6,228,711 B1 | 5/2001 | Hsieh | |
| 6,528,884 B1 | 3/2003 | Lopatin et al. | |
| 6,576,375 B1 * | 6/2003 | Miyoshi et al. | 430/5 |
| 6,812,157 B1 | 11/2004 | Gadgil | |
| 7,045,277 B2 * | 5/2006 | DeBoer et al. | 430/313 |
| 2003/0116439 A1 | 6/2003 | Seo et al. | |
| 2005/0244722 A1 * | 11/2005 | Okada et al. | 430/5 |
| 2006/0257751 A1 * | 11/2006 | Eggers et al. | 430/5 |
| 2007/0243491 A1 | 10/2007 | Wu et al. | |
| 2008/0261120 A1 * | 10/2008 | Gambino et al. | 430/5 |
| 2008/0261121 A1 * | 10/2008 | Gambino et al. | 430/5 |
| 2008/0261122 A1 * | 10/2008 | Gambino et al. | 430/5 |
| 2008/0311485 A1 | 12/2008 | Stanton et al. | |
| 2009/0186283 A1 * | 7/2009 | Stanton et al. | 430/5 |

OTHER PUBLICATIONS

Yamamoto, Norihiro, et al., "Mask Topography Effect with Polarization at Hyper NA" Optical Microlithography XIX, Proc. of SPIE, vol. 6154, (2006), pp. 61544F-1 through 61544F-9.

* cited by examiner

*Primary Examiner* — Stephen Rosasco
*Assistant Examiner* — Stewart A Fraser
(74) *Attorney, Agent, or Firm* — Wells St. John P.S.

(57) ABSTRACT

Some embodiments include methods of forming photomasks. A stack of at least three different materials is formed over a base. Regions of the stack are removed to leave a mask pattern over the base. The mask pattern includes a pair of spaced-apart adjacent segments of the stack. A liner is formed to cover sidewalls of the segments. Some embodiments include photomasks. The photomasks may include a transparent base supporting a pair of spaced-apart adjacent features. The spaced-apart adjacent features may include sidewalls, with inner sidewalls of the spaced-apart features being adjacent one another, and spaced from one another by a gap. A coating layer of from about 5 Angstroms thick to about 50 Angstroms thick may be along the entirety of the sidewalls of the spaced-apart adjacent features. Some embodiments include methods of photolithographically patterning substrates.

14 Claims, 4 Drawing Sheets

METHODS OF FORMING PHOTOMASKS

TECHNICAL FIELD

Photomasks, methods of forming photomasks, and methods of photolithographically-patterning substrates.

BACKGROUND

Integrated circuit fabrication may involve photolithographic processing. For example, photoresist may be provided over a layer that is to be patterned. The photoresist may then be exposed to actinic energy which has been patterned by passing it through a photomask. The patterned actinic radiation exposes selected regions of the photoresist, while leaving other regions unexposed. The exposure of the photoresist to the actinic radiation may alter the solubility of the photoresist in a developer solvent. The developer solvent may thus be utilized to selectively remove either the exposed regions or the unexposed regions, to thereby form a pattern of openings extending partially or wholly through the photoresist. After the pattern of openings is formed in the photoresist, the photoresist may be used as a mask during subsequent etching of the layer under the photoresist, and/or for other process steps (such as, for example, implanting of dopant into such layer).

Photomasks may be fabricated to include a device region and a non-device region. In many applications, the non-device region is composed of a peripheral border region encircling the device region. The device region is the region in which the patterns represent the desired pattern to be imparted to photoresist. The non-device region is the region used for grasping the photomask, and may be the region in which patterns may be formed for alignment structures, bar codes, and other purposes. The term "photomask" may have a couple of different meanings. Historically, the masks utilized to pattern radiation have been categorized as being either photomasks or reticles. The term "photomask" has traditionally been used to refer to masks which define a pattern for an entirety of a wafer, and the term "reticle" has traditionally been used to refer to a patterning tool which defines a pattern for only a portion of a wafer. However, the terms "photomask" (or more generally "mask") and "reticle" are frequently used interchangeably in modern parlance, so that either term can refer to a radiation-patterning tool that encompasses either a portion or an entirety of a wafer. For purposes of interpreting this disclosure and the claims that follow, the terms "reticle" and "photomask" are utilized interchangeably to refer to tools that pattern either a portion of a wafer, or an entirety of a wafer.

Various types of photomasks are known in the art. For example, one type of photomask includes a transparent plate covered with regions of a radiation blocking material, such as chromium, which is used to define the semiconductor feature pattern to be projected by the mask. Such masks are called binary masks, since radiation is completely blocked by the radiation blocking material and fully transmitted through the transparent plate in areas not covered by the radiation blocking material.

Due in part to limitations imposed by the wavelength of light or other actinic energy used to transfer the pattern, resolution can degrade at the edges of the patterns of binary photomasks. Such has led to the development of phase-shifting photomasks. The phase-shifting masks can increase the resolution of patterns by creating phase-shifting regions in transparent areas of the photomask. Standard phase-shifting photomasks are generally formed in one of two manners. In a first, transparent films of appropriate thickness are deposited and patterned over the desired transparent areas using a second level lithography and etch technique. In a second, vertical trenches are etched into the transparent substrate. In both instances, the edges between the phase-shifted and unshifted regions generally result in a transition between high and low refractive index regions. These types of photomasks include transmission areas on either side of a patterned opaque feature. One of these transmission areas transmits light 180° out of phase from the other of the transmission areas, and both may transmit approximately 100% of the incident radiation. Light diffracted underneath the opaque regions from the phase-shifted regions may be destructively canceled by light that is not phase-shifted to thereby create null or "dark" areas.

Another type of phase-shifting photomask is known as an "attenuated" or "half-tone" phase-shifting photomask. Such photomasks include both transparent and less transmissive regions. Actinic energy/radiation passing through a partially transmissive region of such a photomask generally lacks the energy to substantially affect an imaging layer exposed through the photomask. However, the partially transmissive regions of such photomasks are designed to shift passing radiation 180° relative to the radiation passing through the completely transmissive regions and, as a consequence, the radiation passing through the partially transmissive regions destructively interferes with radiation diffracting out from the edges of the completely transmissive regions. Photomasks have been proposed that use both binary features and attenuating phase-shift mask features in the device area.

As minimum device pitch falls below 100 nanometers (for example, where minimum feature size or minimum critical dimension falls below 50 nanometers), attenuated phase-shift photomasks may begin to lose contrast with specific wavelengths of actinic energy.

DETAILED DESCRIPTION OF THE ILLUSTRATED EMBODIMENTS

Some embodiments include finished-construction photomasks that may be used to fabricate integrated circuitry. In the context of this document, a "finished-construction" photomask is a photomask which has been fabricated to completion whereby no additional layer(s)/material(s) will be deposited on the photomask or removed from the photomask. Accordingly, a "finished-construction" photomask does not encompass any intermediate structure of a photomask that has not been fabricated to completion. However, some embodiments may also include intermediate construction photomasks, or in other words, photomasks which are not of a finished-construction.

Figure 1:
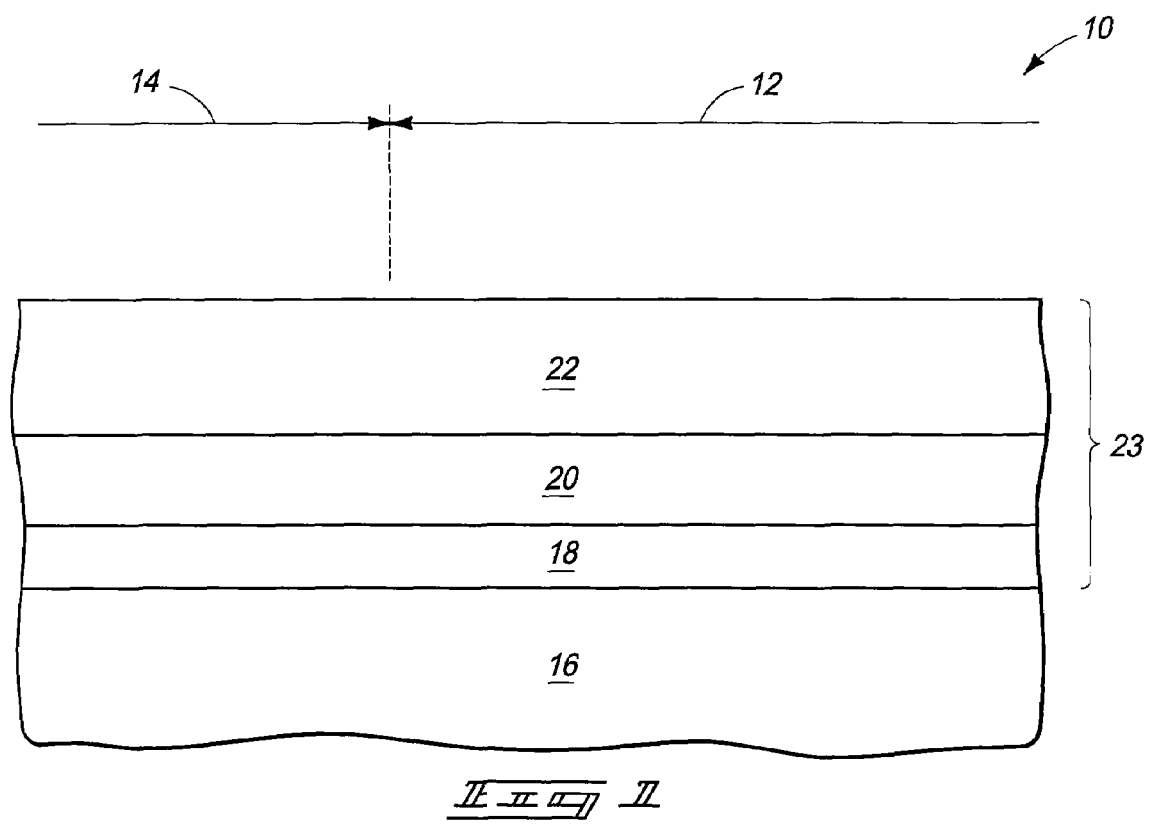
FIG. 1 is a diagrammatic view of a portion of a photomask construction in process in accordance with an embodiment.

A photomask construction 10 is illustrated in FIG. 1, with the photomask construction being at a processing stage prior to formation of a pattern of features within the photomask construction. The photomask construction includes a device region 12 and a non-device region 14. Formation of mask pattern features may or may not occur with respect to both regions. However, the example embodiments described herein pertain to fabrication of the features within device region 12.

The construction 10 comprises a transparent base 16. The base may comprise any suitable material, and in some embodiments may comprise, consist essentially of, or consist of quartz. The quartz of base 16 may have an example thickness range of from about 0.125 inch to about 0.25 inch.

A layer 18 of phase-shifting material is over base 16. Layer 18 may comprise any existing or yet-to-be developed phase-shifting material. In some embodiments, phase-shifting material 18 may include one or more compositions selected from the group consisting of $MoSi_x$, $MoSi_xO_y$, $MoSi_xO_yN_z$, $Ta_xHf_y$, $Ta_xN_y$, and $Si_xO_xN_y$, where "x", "y", and "z" are greater than zero. In some embodiments, material 18 may comprise, consist essentially of, or consist of molybdenum silicide.

Material 18 may will have a refractive index (a so-called "n-value") and an absorption coefficient (a so-called "k-value"). The thickness of material 18, together with the n-value and k-value, will determine the amount of transmission of a given wavelength of light through material 18. The material 18 may have any suitable thickness. In some embodiments, material 18 may have a thickness of less than or equal to about 10 nanometers, less than or equal to about 7 nanometers, or even less than or equal to about 4 nanometers. In some embodiments, material 18 may have a thickness of from about 1 nanometer to about 7 nanometers.

If material 18 comprises molybdenum silicide, the molybdenum silicide may be pure molybdenum silicide, or may be doped with one or more suitable dopants (such as, for example, one or more of boron, phosphorus, germanium, etc.). The dopants may alter one or more properties of material 18 relative to pure molybdenum silicide, and in some embodiments may alter one or both of the n-value and the k-value of material 18 relative to pure molybdenum silicide.

A pair of materials 20 and 22 are formed over material 18. Materials 20 and 22 may comprise any suitable compositions; and together with material 18 will be used to form light-attenuating features (described below with reference to FIG. 2). The materials 18, 20 and 22 may be considered to together form a light-attenuating stack 23.

In some embodiments, materials 20 and 22 may include one or more compositions selected from the group consisting of chromium, $MoSi_x$, $MoSi_xO_y$, $MoSi_xO_yN_z$, $Ta_xHf_y$, $Ta_xN_y$, and $Si_xO_xN_y$, where "x", "y", and "z" are greater than zero.

Material 20 differs in composition from material 18, and material 22 differs in composition from material 20. In some embodiments, material 22 may differ in composition from material 18, and in other embodiments materials 22 and 18 may be the same composition as one another.

Materials 20 and 22 may have any suitable thicknesses, n-values and k-values; and may be tailored to achieve desired attenuation of radiation passing through materials 18, 20 and 22. Although materials 20 and 22 are shown having different thicknesses from one another, in other embodiments the materials 20 and 22 may have the same thickness as one another. Also, one or both of the materials 20 and 22 may differ in thickness from material 18, or may be the same thickness as material 18. In some embodiments, materials 20 and 22 have thicknesses of from about 10 nanometers to about 50 nanometers. In one example embodiment, material 20 has a thickness of about 31 nanometers, and material 22 has thickness of about 15 nanometers. In such example embodiment, material 18 may have a thickness of about 7 nanometers.

The materials 18, 20 and 22 may be tailored to achieve desired attenuation and/or phase-shifting of light passing into the stack 23. Some example substances that may be used for one or more of materials 18, 20 and 22 are molybdenum silicide (n-value 2.34, k-value 0.58); chrome (n-value 0.84, k-value 1.65); quartz (n-value 1.66, k-value 0); silicon nitride (n-value 2.66, k-value 0.25) and silicon (n-value 0.88, k-value 2.76), with the example reported n-values and k-values being relative to 193 nanometer light.

In some embodiments, all of materials 18, 20 and 22 may comprise molybdenum silicide; and one or more of the materials may be doped to achieve differences between the materials. In one example of such embodiments, materials 18 and 22 may be the same as one another, and material 20 may differ from materials 18 and 22 in one or both of an amount of dopant in the material 20, and a type of dopant in the material 20. In another example, all of materials 18, 20 and 22 may differ from one another in either the amount of dopant in the materials, or the type of dopant within the materials.

Although the shown light-attenuating stack 23 comprises three separate materials, in other embodiments the stack may comprise more than three materials.

Figure 2:
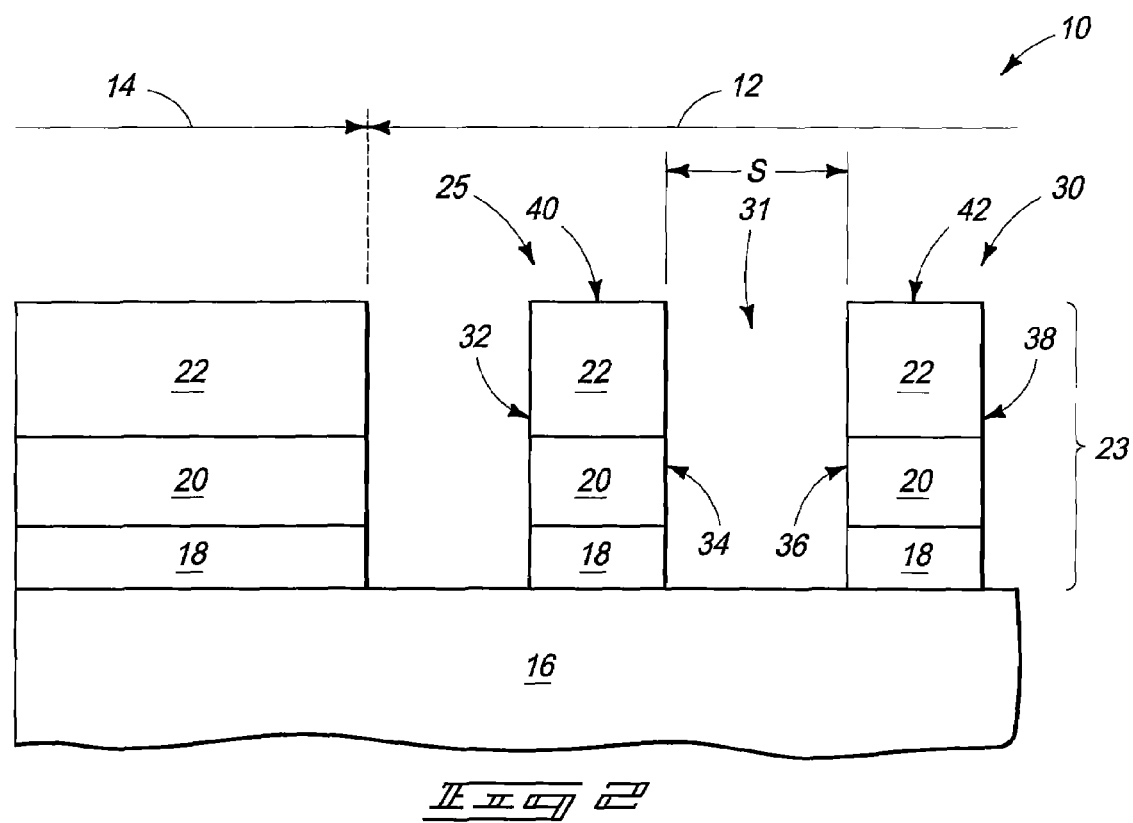
FIG. 2 is a view of the FIG. 1 photomask construction at a processing stage subsequent to that shown by FIG. 1.

Referring to FIG. 2, portions of stack 23 are removed from over base 16 to leave a mask pattern of materials 18, 20 and 22 over the base. In the depicted example embodiment, the removal of the portions of stack 23 has formed openings that extend entirely through stack 23 (and specifically that extend completely through layers 18, 20 and 22). In other embodiments, at least some of the openings may only extend partially through the stack 23. The shown patterning only patterns the stack 23 within the device region 12. In other embodiments, some patterning may also occur in the non-device region 14.

The removal of portions of stack 23 leaves a pair of spaced-apart adjacent features 25 and 30 over base 16. More than two spaced apart features may be formed, but only two of such features are shown in FIG. 2 to simplify the drawing. The spaced-apart features may be considered to be segments of stack 23 in some embodiments.

Feature 25 comprises sidewalls 32 and 34; and feature 30 comprises sidewalls 36 and 38. The sidewalls include exposed sections of all of the materials 18, 20 and 22.

Sidewalls 34 and 36 face one another, and may be considered to be inner sidewalls of the adjacent features 25 and 30. The sidewalls 32 and 38 may be considered to be outer sidewalls of the adjacent features.

The features 25 and 30 have uppermost surfaces 40 and 42, respectively. The uppermost surfaces 40 and 42 extend across the top of material 22, and are orthogonal relative to sidewalls 32, 34, 36 and 38.

In some embodiments, inner sidewalls 34 and 36 of the adjacent features 25 and 30 may be spaced from one another by a distance "S" that is less than or equal to about 50 nanometers, less than or equal to about 40 nanometers, or even less than or equal to about 30 nanometers. When the inner sidewalls are very close to one another, such can lead to problems that, at least in part, motivated some aspects of the invention. Specifically, there can be difficulties in overcoming contrast issues with photomasks where a minimum critical dimension between adjacent features is less than or equal to about 50 nanometers for certain incident actinic energy wavelengths.

The features 25 and 30 are spaced from one another by a gap 31, and a surface of base 16 is exposed within such gap.

Figure 3:
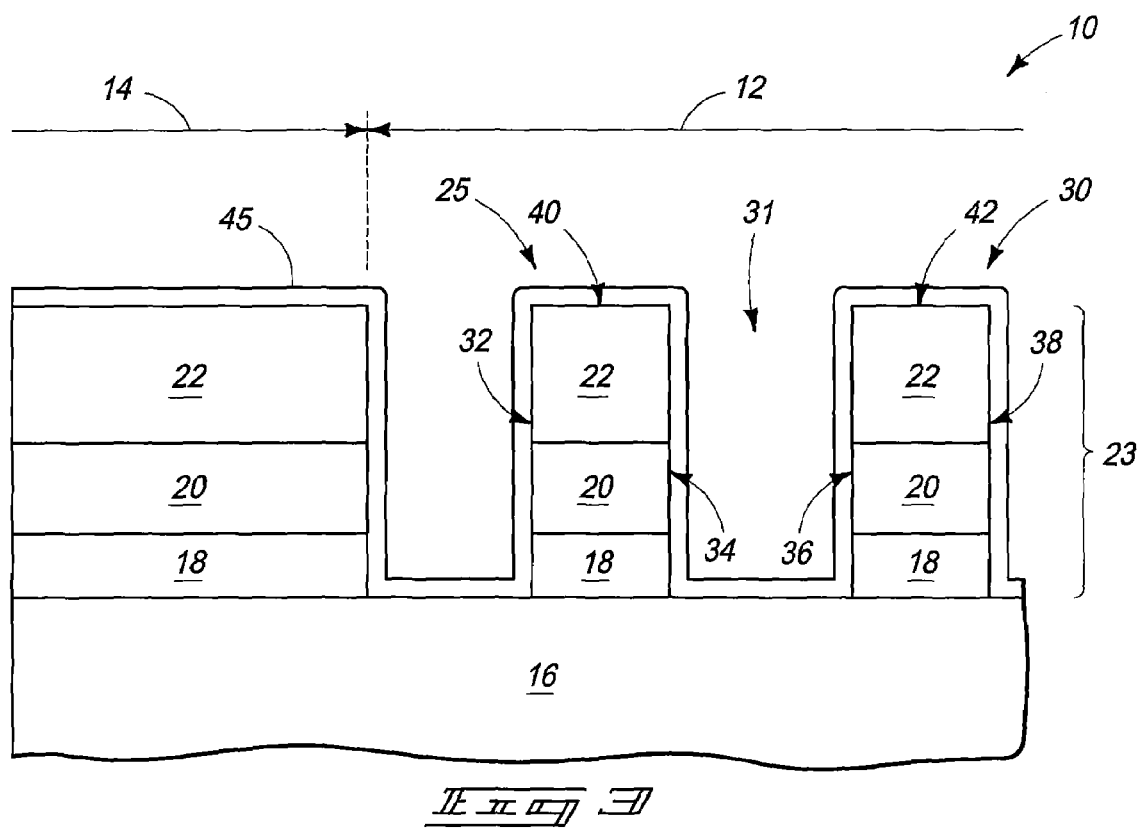
FIG. 3 is a diagrammatic view of a portion of a photomask construction in accordance with an embodiment.

Referring to FIG. 3, a coating layer 45 (which may alternatively be referred to as a liner) is formed over sidewalls 32, 34, 36, and 38 of features 25 and 30, across the uppermost surfaces 40 and 42 of the features, and across the surface of base 16 that had been exposed within gap 31. The coating layer may have any suitable thickness, and may, for example, have a thickness of less than about 50 Å. In some embodiments the coating layer may have a thickness of from about 5 Å to about 50 Å.

The coating layer comprises a material, and in some embodiments the material of the coating layer may be referred to as a liner material. The material of the coating layer may comprise, consist essentially of, or consist of one or more of dielectric compositions, conductive compositions, and/or semiconductive compositions. In some embodiments, the material of the coating layer 45 may comprise, consist essentially of, or consist of one or more of $SiO_2$, $Si_3N_4$, $SrF_2$, $MgF_2$, $MgF_2$, $Al_2O_3$, $BaF_2$, Al, TiN, Cu, Cr and Si.

Coating layer 45 may be deposited utilizing any suitable methodology, such as, for example, one or more of chemical vapor deposition (CVD), physical vapor deposition (PVD), and atomic layer deposition (ALD). Although only one coating layer is shown, in other embodiments there may be more than one coating layer.

The construction 10 of FIG. 3 may be a finished-construction photomask in some embodiments. In other embodiments, the construction 10 of FIG. 3 may be an intermediate-construction photomask, and may be subsequently subjected to additional processing (for instance, the processing of one or more of FIGS. 4, 5 and 6, discussed below) to complete a photomask construction.

Depending upon the nature and/or thickness of coating layer 45, the coating layer may be essentially completely transmissive of certain actinic energy/radiation or may be effectively blocking thereof. The thickness of a material is conventionally determined orthogonally relative to a closest surface over which the material is received. Accordingly and by way of example only, coating layer 45 is depicted as being of a uniform or constant thickness over materials 16, 18, 20 and 22. However with respect to, or in the context of, passage of actinic energy through coating layer 45, such is of variable thickness particularly with respect to incident actinic energy which is orthogonal to substrate 10. Such energy may go both through those vertically depicted "thicker" portions of layer 45 that are along sidewalls 32, 34, 36, and 38, and through those horizontally depicted "thinner" portions of layer 45 that are received between the "thicker" portions between spaced adjacent features 25 and 30. Accordingly, while the composition and thickness of coating layer 45 may be effective to allow actinic energy through the "thinner" portions of coating layer 45, the "thicker" portions may or may not allow passage of the actinic energy therethrough. If actinic radiation cannot pass through the "thicker" regions of coating layer 45, the lateral thickness of coating layer 45 along sidewalls 32, 34, 36, and 38 effectively widens the feature widths. The artisan can take such into consideration when designing a photomask.

Figure 4:
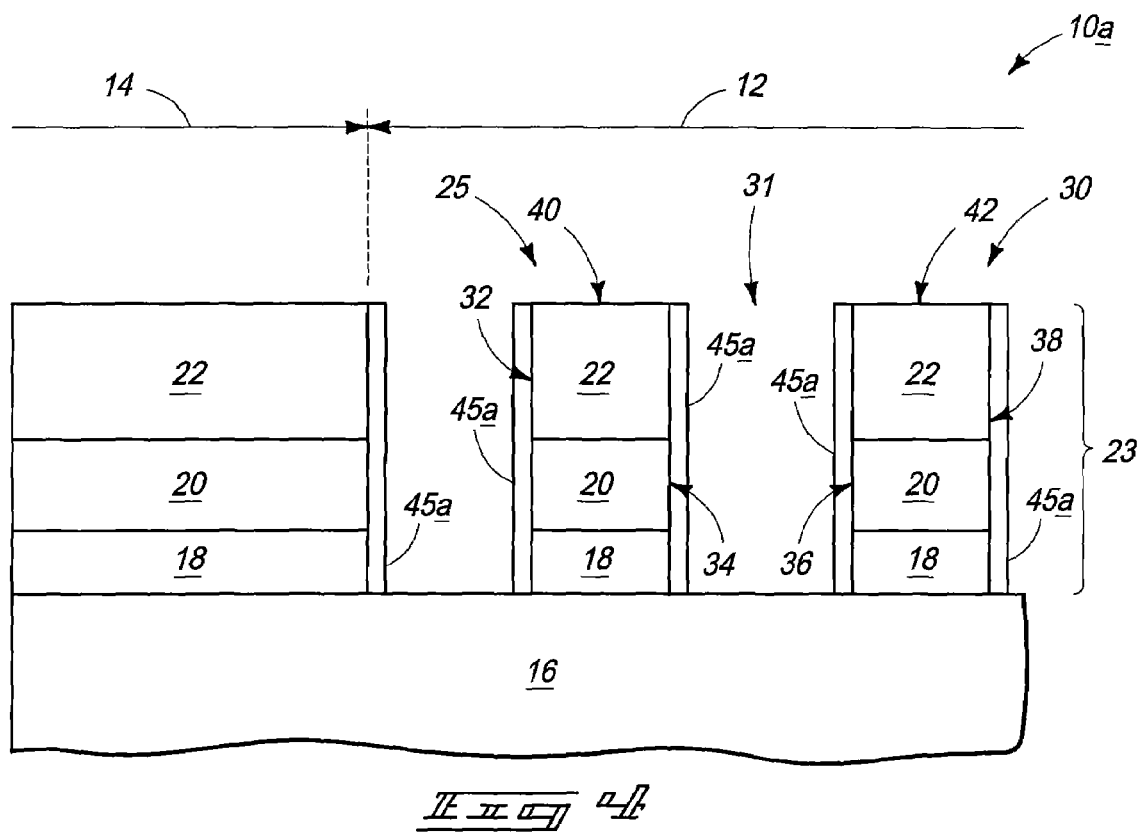
FIG. 4 is a diagrammatic view of a portion of a photomask construction in accordance with an embodiment.

Another example embodiment photomask is depicted in FIG. 4 as a photomask construction 10a. Like numerals will be used to describe the embodiment of FIG. 4 as were utilized to describe FIGS. 1-3, where appropriate; with differences indicated by the suffix "a".

The construction 10a of FIG. 4 includes a coating layer 45a. The coating layer 45a is not along the uppermost surfaces 40 and 42 of the spaced-apart adjacent features 25 and 30. Further, the coating layer 45a is not along all of transparent base material 16 within the gap 31 between the pair of adjacent features 25 and 30.

The construction of FIG. 4 may be made by patterning the coating layer after the processing stage shown in FIG. 3. Specifically, a patterned mask (not shown) may be formed over the construction of FIG. 3 to leave some segments of the coating layer exposed, while protecting other segments of the coating layer. Subsequently, the exposed segments of the coating layer may be removed, followed by removal of the protective mask to leave the construction of FIG. 4.

Figure 5:
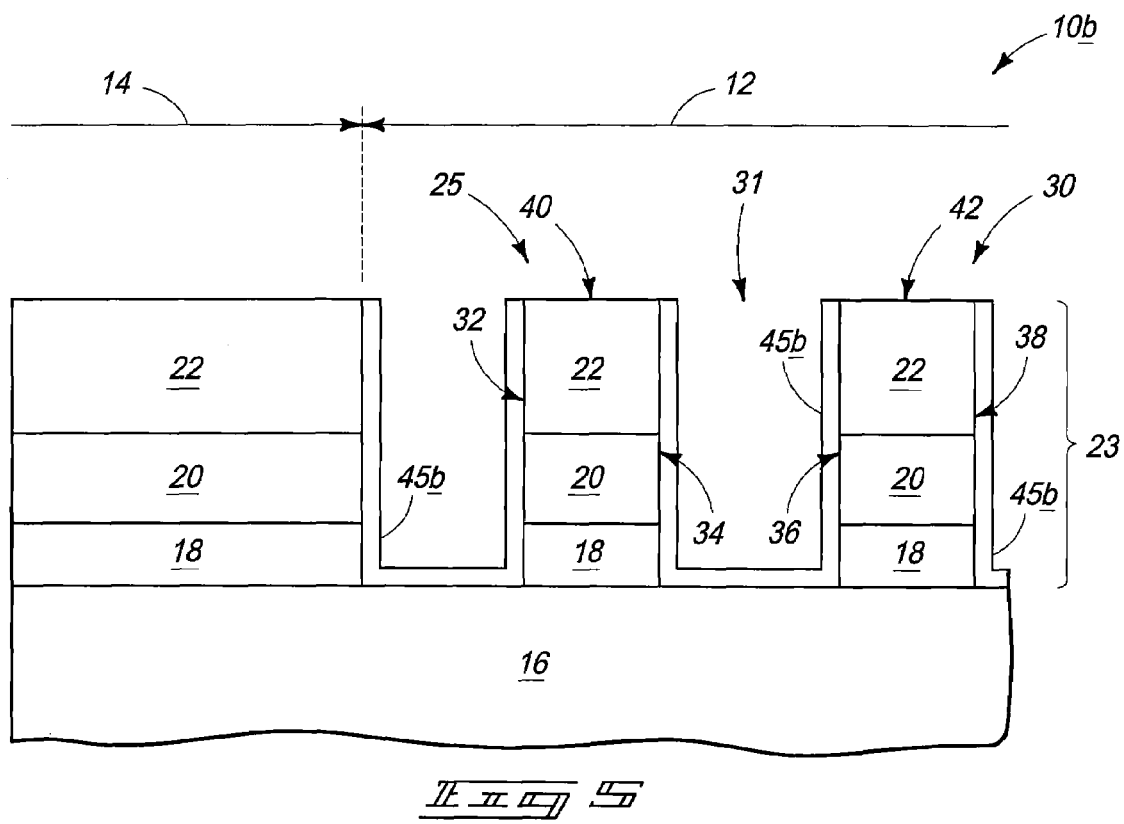
FIG. 5 is a diagrammatic view of a portion of a photomask construction in accordance with an embodiment.

Another example embodiment photomask is depicted in FIG. 5 as a photomask construction 10b. Like numerals will be used to describe the embodiment of FIG. 5 as were utilized to describe FIGS. 1-3, where appropriate; with differences indicated by the suffix "b".

The construction 10b of FIG. 5 includes a coating layer 45b. The coating layer 45b is not along the uppermost surfaces 40 and 42 of the spaced-apart adjacent features 25 and 30, but is along the surface of base 16 within the gap 31 between the features 25 and 30.

The construction of FIG. 5 may be made by patterning the coating layer after the processing stage shown in FIG. 3. Specifically, a patterned mask (not shown) may be formed over the construction of FIG. 3 to leave some segments of the coating layer exposed, while protecting other segments of the coating layer. Subsequently, the exposed segments of the coating layer may be removed, followed by removal of the protective mask to leave the construction of FIG. 5.

Figure 6:
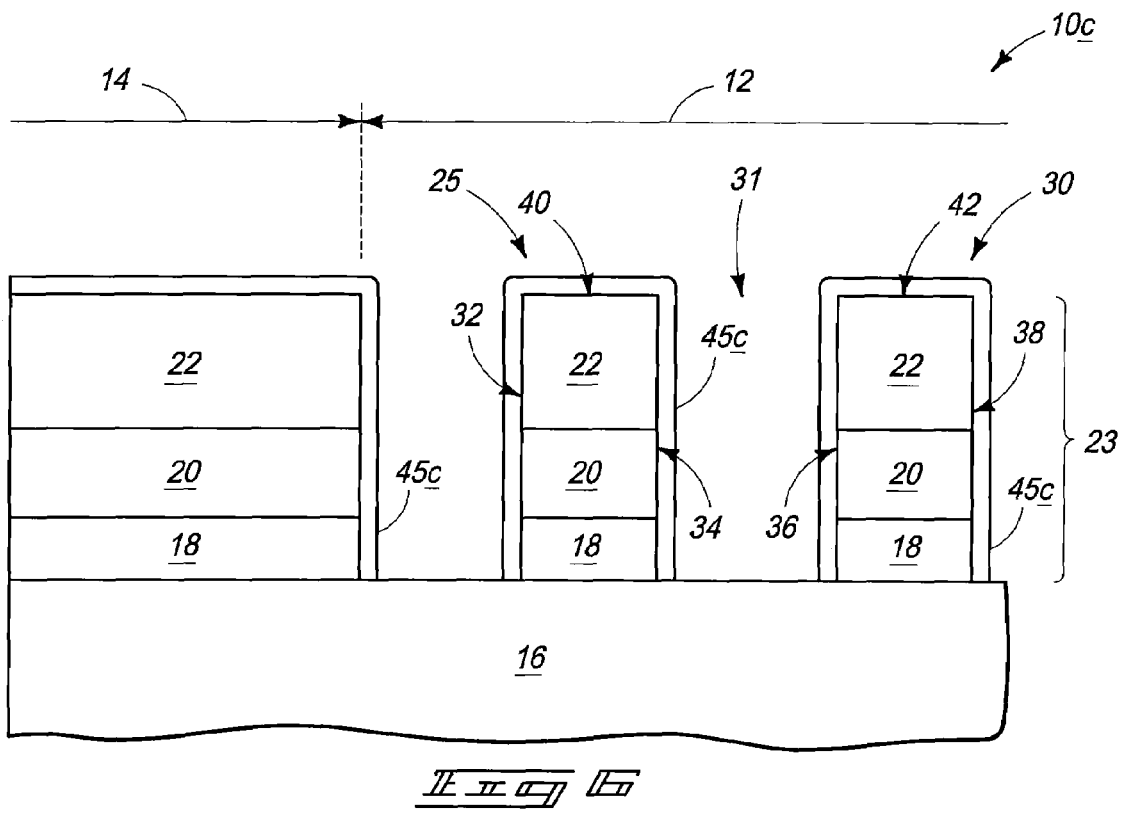
FIG. 6 is a diagrammatic view of a portion of a photomask construction in accordance with an embodiment.

Another example embodiment photomask is depicted in FIG. 6 as a photomask construction 10c. Like numerals will be used to describe the embodiment of FIG. 6 as were utilized to describe FIGS. 1-3, where appropriate; with differences indicated by the suffix The construction 10c of FIG. 6 includes a coating layer 45c. The coating layer 45c is along uppermost surfaces 40 and 42 of the features 25 and 30; but is not along the exposed surface of base 16 within the gap 31 between the features 25 and 30.

The construction of FIG. 6 may be made by patterning the coating layer after the processing stage shown in FIG. 3. Specifically, a patterned mask (not shown) may be formed over the construction of FIG. 3 to leave some segments of the coating layer exposed, while protecting other segments of the coating layer. Subsequently, the exposed segments of the coating layer may be removed, followed by removal of the protective mask to leave the construction of FIG. 6.

Figure 7:
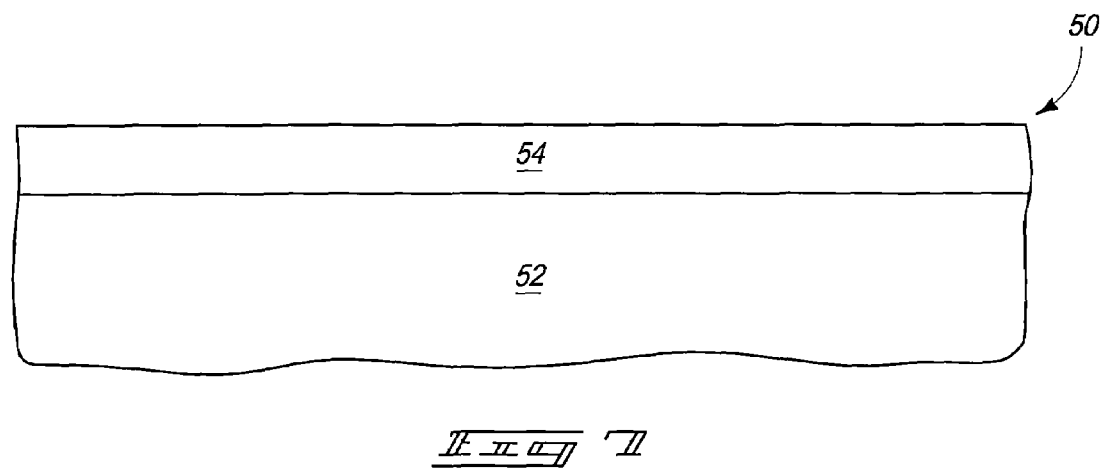
FIG. 7 is a diagrammatic view of a portion of a semiconductor substrate.

Some embodiments include methods of photolithographically patterning a substrate using one or more of the example photomasks of FIGS. 3-6. FIG. 7 depicts an example substrate 50 that may be photolithographically patterned. Substrate 50 includes a material 52 having an imaging layer 54 formed thereover. The term "imaging layer" means a layer which is capable of having its solvent solubility changed by exposure to suitable actinic energy. Photoresist and certain polyimides are examples of materials that may be utilized in imaging layers.

Figure 8:
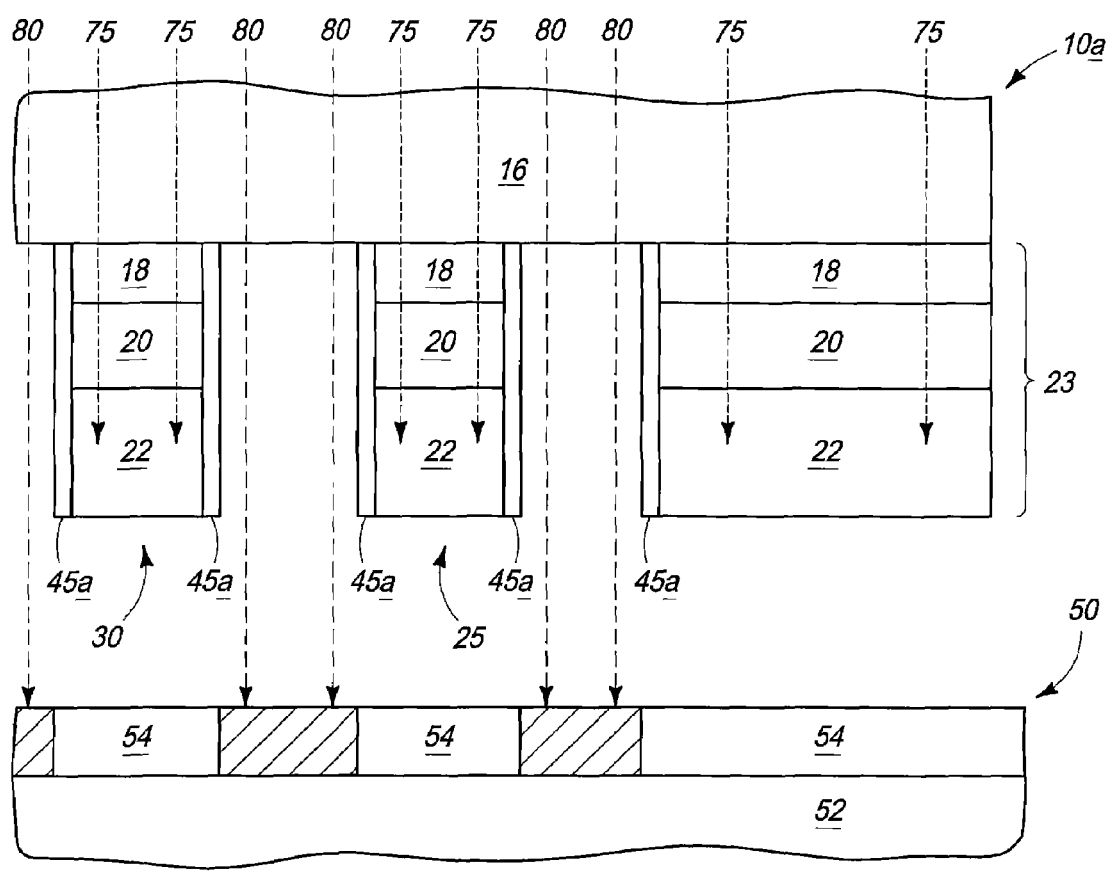
FIG. 8 is a view of the FIG. 7 semiconductor substrate at a processing subsequent to that shown by FIG. 7, and using the photomask construction of FIG. 4.

Referring to FIG. 8, a photomask 10a has been positioned proximate imaging layer 54. Although the photomask 10a is specifically shown in FIG. 8, any of the above-described photomasks 10, 10a, 10b and 10c may be utilized for the processing of FIG. 8.

The processing illustrated in FIG. 8 has actinic energy directed through the mask 10a and toward the imaging layer

54. The actinic energy is depicted by arrows 75 and 80; with the arrows 75 showing radiation blocked by the light-attenuating stack 23 of materials 18, 20, and 22; and with the arrows 80 showing radiation passing between features formed of stack 23, and onto imaging layer 54 of substrate 50. In some embodiments, the light-attenuating stack 23 may totally block the actinic radiation from passing therethrough (as shown), and in other embodiments the light-attenuating stack may attenuate the energy of the actinic radiation passing therethrough without totally blocking such radiation.

Without necessarily being limited by any theory of operation or necessarily in the end result in a broadest sense, the above-described photolithographic patterning with one or more of the example embodiment photomasks, at least when processing at critical dimensions at or below 50 nanometers, may provide better contrast in the layer being patterned relative to conventional photomasks. Such may occur by absorbing a greater quantity of a transverse magnetic component of the impinging actinic energy relative to the facing sidewalls of spaced-apart adjacent features than a transverse electric component of the impinging actinic energy. Alternately considered, a significant quantity of the transverse magnetic component is absorbed while a significant component of the transverse electric component of the impinging actinic energy is reflected. Such may be facilitated/enhanced by the presence of the coating layer received against the sidewalls of the spaced-apart feature sidewalls as described above. Accordingly, in some embodiments, the impinging of actinic radiation on a photomask may comprise absorbing a greater quantity of a transverse magnetic component of the impinging actinic energy by a coating layer relative to a transverse electric component of the impinging actinic energy.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming a photomask, comprising:
   forming a stack of at least three materials over a base, wherein all of said three materials comprise molybdenum and silicon, and wherein at least two of said three materials are compositionally different from one another;
   removing regions of the stack to leave a mask pattern of the stack over the base, the mask pattern comprising a pair of spaced-apart adjacent segments of the stack, said segments comprising sidewalls that include exposed sections of said at least three materials; and
   forming a liner that covers and is directly against all of the exposed sections of sidewalls; wherein the liner is composed of a liner material that comprises one or both of TiN and Cu.

2. The method of claim 1 wherein at least two of the at least three materials differ from one another in refractive index and absorption coefficient.

3. The method of claim 1 wherein:
   the at least three materials is exactly three materials;
   the stack comprises one of the three materials sandwiched between the other two of the three materials; and
   said other two of the three materials are the same composition as one another, and differ in composition from said one of the three materials.

4. The method of claim 1 wherein the forming of the liner comprises atomic layer deposition of the liner material, and wherein the liner has a thickness of less than or equal to 50 Å.

5. The method of claim 1 wherein the liner has a thickness of from about 5 Å to about 50 Å.

6. The method of claim 1 wherein:
   the base comprises quartz; and
   one of said three materials is a lowermost material of the stack and is directly against the base.

7. The method of claim 6 wherein said one of the three materials has a thickness of less than or equal to about 10 nanometers.

8. The method of claim 6 wherein said one of the three materials has a thickness of less than or equal to about 7 nanometers.

9. A method of forming a photomask, comprising:
   forming a phase-shifting material over a transparent material base;
   forming two or more additional materials over the phase-shifting material; the phase-shifting material together with the two or more additional materials forming a light-attenuating stack;
   removing portions of the light-attenuating stack to leave segments of the light-attenuating stack remaining over the transparent material as a mask pattern, the mask pattern comprising a pair of adjacent features; said features comprising horizontal top surfaces, and comprising vertical sidewall surfaces that extend downwardly from the top surfaces to the base; the vertical sidewall surfaces extending along all of the materials of the light-attenuating stack; the adjacent features being spaced apart from one another by a gap, a horizontal surface of the base being exposed within said gap;
   coating the horizontal top surfaces of the features, the horizontal surface of the base, and the vertical sidewall surfaces of the features with a coating material; and
   utilizing an etch to remove the coating material from along the horizontal top surfaces of the features and/or along the horizontal surface of the base, while leaving the coating material along the vertical sidewall surfaces of the features.

10. The method of claim 9 wherein said phase-shifting material comprises molybdenum and silicon.

11. The method of claim 9 wherein the coating material comprises one or both of TiN and Cu.

12. The method of claim 9 wherein the etch removes the coating material from along the horizontal top surfaces of the features and from along the horizontal surface of the base.

13. The method of claim 9 wherein the etch removes the coating material from along the horizontal top surfaces of the features, while leaving the coating material along the horizontal surface of the base and along the vertical sidewall surfaces of the features.

14. The method of claim 9 wherein the etch removes the coating material from along the horizontal surface of the base, while leaving the coating material along the horizontal top surfaces of the features and along the vertical sidewall surfaces of the features.

* * * * *